United States Patent
Oh

(10) Patent No.: US 10,984,866 B2
(45) Date of Patent: Apr. 20, 2021

(54) NON-VOLATILE MEMORY DEVICE UTILIZING DUMMY MEMORY BLOCK AS POOL CAPACITOR

(71) Applicant: Yangtze Memory Technologies Co., Ltd., Wuhan (CN)

(72) Inventor: Jin Yong Oh, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 0 days.

(21) Appl. No.: 16/699,070

(22) Filed: Nov. 28, 2019

(65) Prior Publication Data

US 2021/0065800 A1 Mar. 4, 2021

Related U.S. Application Data

(63) Continuation of application No. PCT/CN2019/104199, filed on Sep. 3, 2019.

(51) Int. Cl.

| | | |
|---|---|---|
| G11C 8/12 | (2006.01) | |
| H01L 27/11551 | (2017.01) | |
| H01L 27/11578 | (2017.01) | |
| H01L 27/11524 | (2017.01) | |
| G11C 16/04 | (2006.01) | |
| G11C 16/28 | (2006.01) | |

(52) U.S. Cl.
CPC .......... *G11C 16/0483* (2013.01); *G11C 8/12* (2013.01); *G11C 16/28* (2013.01); *H01L 27/11524* (2013.01); *H01L 27/11551* (2013.01); *H01L 27/11578* (2013.01)

(58) Field of Classification Search
CPC ................... H01L 27/11524; H01L 27/11551; G11C 8/12
USPC ....................................................... 365/230.03
See application file for complete search history.

(56) References Cited

U.S. PATENT DOCUMENTS

| | | | |
|---|---|---|---|
| 7,995,370 B2 | 8/2011 | Koide | |
| 8,891,324 B2 | 11/2014 | Yi | |
| 10,014,315 B2 * | 7/2018 | Kim | ................... H01L 27/11519 |
| 10,325,775 B2 | 6/2019 | Sung | |
| 2007/0040599 A1 | 2/2007 | Sato | |
| 2009/0323390 A1 | 12/2009 | Takizawa | |
| 2010/0157677 A1 | 6/2010 | Furuyama | |
| 2013/0130468 A1 | 5/2013 | Higashitani | |
| 2013/0258796 A1 | 10/2013 | Hioka | |
| 2017/0053932 A1 * | 2/2017 | Jeon | ................... H01L 27/11568 |
| 2020/0013434 A1 * | 1/2020 | Lin | ........................ G11C 16/08 |

(Continued)

FOREIGN PATENT DOCUMENTS

| | | |
|---|---|---|
| CN | 106252353 A | 12/2016 |
| CN | 108962909 A | 12/2018 |
| CN | 109817629 A | 5/2019 |

(Continued)

*Primary Examiner* — Son L Mai

(74) *Attorney, Agent, or Firm* — Winston Hsu

(57) ABSTRACT

A non-volatile memory device includes a plurality of memory blocks grouped into pages, page buffer regions corresponding to the pages of the plurality of memory blocks; and a peripheral circuit region for supporting operations of the pages of the plurality of memory blocks. The peripheral circuit region comprises a plurality of pool capacitors. At least one of the memory blocks is a dummy block. The dummy block is configured to form a supplementary pool capacitor for suppressing power noise.

10 Claims, 6 Drawing Sheets

(56) References Cited

U.S. PATENT DOCUMENTS

2020/0013794 A1* 1/2020 Dunga ................... G11C 16/28
2020/0194448 A1* 6/2020 Kim .................... H01L 23/5226

FOREIGN PATENT DOCUMENTS

| | | |
|---|---|---|
| JP | 2008-218842 A | 9/2008 |
| TW | 454342 | 9/2001 |
| TW | 518598 | 1/2003 |
| TW | I534812 B | 5/2016 |
| TW | I584296 B | 5/2017 |
| TW | I633549 B | 8/2018 |
| TW | I656534 B | 4/2019 |

* cited by examiner

NON-VOLATILE MEMORY DEVICE UTILIZING DUMMY MEMORY BLOCK AS POOL CAPACITOR

CROSS REFERENCE TO RELATED APPLICATIONS

The present patent application is a continuation of PCT application Ser. No. PCT/CN2019/104199, filed Sep. 3, 2019, designating the United States, which is hereby incorporated by reference.

BACKGROUND OF THE INVENTION

1. Field of the Invention

The present disclosure relates to the field of non-volatile memory technology. More particularly, the present disclosure relates to a three-dimensional (3D) NAND memory device utilizing a dummy memory block as a pool capacitor.

2. Description of the Prior Art

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit. 3D memory architecture can address the density limitation in planar memory cells. 3D memory architecture includes a memory array and peripheral devices for controlling signals to and from the memory array.

It is known that capacitors in the peripheral circuits suppress power noises such that memory devices can operation in stable power conditions. It is also known that pool capacitors occupy large spacer in gate or metal layer within peripheral circuit regions of conventional 3D NAND memory device. However, as the die size shrinks, it becomes challenging when deploying capacitors in the peripheral circuit regions for maintaining stable internal power level with low noises. It is important to supply stable power for the operations of sense amplifier and page register of NAND memory devices.

SUMMARY OF THE INVENTION

It is one object of the present disclosure to provide an improved non-volatile memory device utilizing dummy memory blocks as pool capacitors in order to solve the above-mentioned prior art problems or shortcomings.

According to one aspect of the present disclosure, a non-volatile memory device includes a plurality of memory blocks grouped into pages, page buffer regions corresponding to the pages of the plurality of memory blocks; and a peripheral circuit region for supporting operations of the pages of the plurality of memory blocks. The peripheral circuit region comprises a plurality of pool capacitors. At least one of the memory blocks is a dummy block. The dummy block is configured to form a supplementary pool capacitor for suppressing power noise.

According to some embodiments, the dummy block comprises a substrate and an alternating layer stack on the substrate.

According to some embodiments, the alternating layer stack comprises multiple conductive layers and multiple dielectric layers alternately laminated on one another.

According to some embodiments, the dummy block further comprises: stair structures at two opposite ends of the dummy block; and contacts disposed on the stair structures and electrically connected to the multiple conductive layers.

According to some embodiments, the multiple conductive layers are sequentially and alternately biased to a power source and a ground potential via the contacts disposed on the stair structures, thereby forming capacitors between the multiple conductive layers, wherein the multiple dielectric layers act as a capacitor dielectric.

According to some embodiments, the power source comprises an internal power source or an external power source.

According to some embodiments, at least two neighboring conductive layers of the multiple conductive layers are biased to a same power source via the contacts disposed on the stair structures.

According to some embodiments, the dummy block is disposed at an outskirt of each of the pages of the plurality of memory blocks.

According to some embodiments, the dummy block is split into multiple sub-blocks.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1:
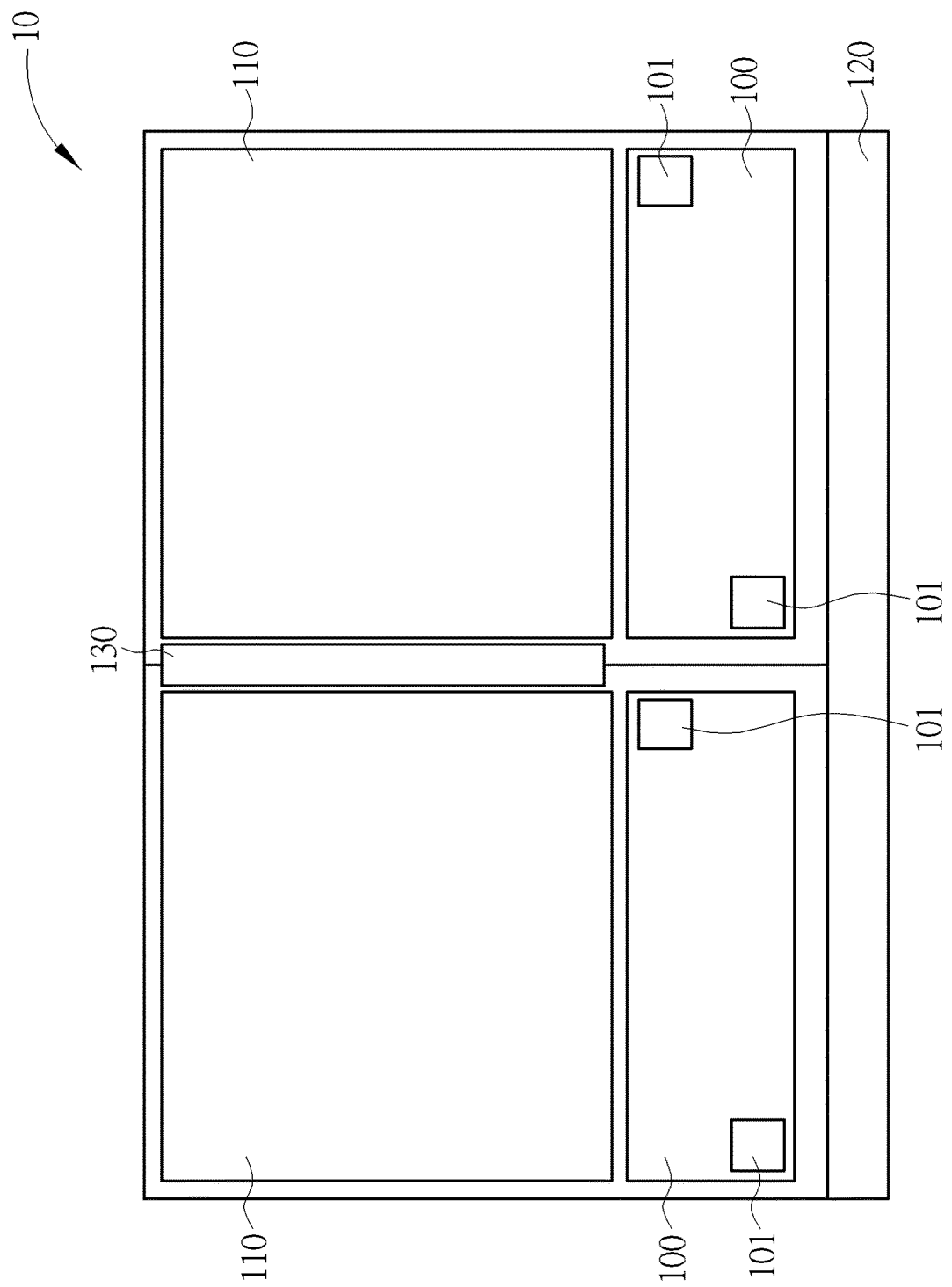
FIG. 1 is a schematic diagram showing an exemplary NAND architecture with pool capacitors for power sources, wherein the memory arrays are omitted.

Embodiments of the present disclosure will be described with reference to the accompanying drawings.

DETAILED DESCRIPTION

Reference will now be made in detail to exemplary embodiments of the invention, which are illustrated in the accompanying drawings in order to understand and implement the present disclosure and to realize the technical effect. It can be understood that the following description has been made only by way of example, but not to limit the present disclosure. Various embodiments of the present disclosure and various features in the embodiments that are not conflicted with each other can be combined and rearranged in various ways. Without departing from the spirit and scope of the present disclosure, modifications, equivalents, or improvements to the present disclosure are understandable to those skilled in the art and are intended to be encompassed within the scope of the present disclosure.

It is noted that references in the specification to "one embodiment," "an embodiment," "an exemplary embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment.

Further, when a particular feature, structure or characteristic is described in contact with an embodiment, it would be within the knowledge of a person skilled in the pertinent art to affect such feature, structure or characteristic in contact with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. The term "vertical" refers to the direction perpendicular to the surface of a semiconductor substrate, and the term "horizontal" refers to any direction that is parallel to the surface of that semiconductor substrate.

As used herein, the term "3D memory device" refers to a semiconductor device with vertically oriented strings of memory cell transistors (referred to herein as "memory strings," such as NAND strings) on a laterally-oriented substrate so that the memory strings extend in the vertical direction with respect to the substrate.

3D NAND is a flash memory technology which stacks memory cells vertically to increase capacity for higher storage density and lower cost per gigabyte. In 3D NAND technology, memory cells are operated at high voltages, and capacitors (e.g., pool capacitors) are required to implement voltage boosting. Typically, MOS capacitors, MOM capacitors, or poly-to-poly capacitors are used in 3D NAND chip circuits. As 3D NAND technology is moving toward high density and high capacity, especially from 64-layer to 128-layer scheme, the number of devices and the number of traces increase significantly, while the area of chip continues to shrink. As a result, the space for silicon wafer and back-end routing is getting smaller and smaller. Conventional MOS capacitors or MOM capacitors usually require a large chip area or metal trace area in the back-end stage.

FIG. 1 is a schematic diagram showing an exemplary NAND architecture with pool capacitors for power sources, wherein the memory arrays are omitted for the sake of clarity. As shown in FIG. 1, the NAND memory device 10 comprises pool capacitors 101 for power sources, which are disposed within the peripheral circuit regions 100. The peripheral circuit regions 100 may be disposed between the page buffer regions 110 and the input/output (I/O) power pad region 120. The page buffer regions 110 may store data received from an external device (e.g., a host), before the data is written to a relevant portion of the memory arrays, or store data read from the memory arrays before the data is transmitted to the external device. The page buffer regions 110 may be coupled to string driver circuit 130 for driving voltages to word lines (not shown). The string driver circuit 130 may be disposed between the page buffer regions 110. The layout shown in FIG. 1 may be part of the periphery under cell (PUC) space located under a memory array, which is not shown so as to not obscure the figure.

As previously mentioned, the die size continues to shrink and the available area for pool capacitors 101 decreases. This results in insufficient pool capacitor area in the peripheral circuits for suppressing power noises. The present disclosure addresses this issue by introducing dummy blocks in the memory arrays, which function as supplementary pool capacitors to improve the noise suppression such that the memory devices can be operated in stable power conditions. Therefore, the reliability and device performance of the memory devices can be improved.

Figure 2:
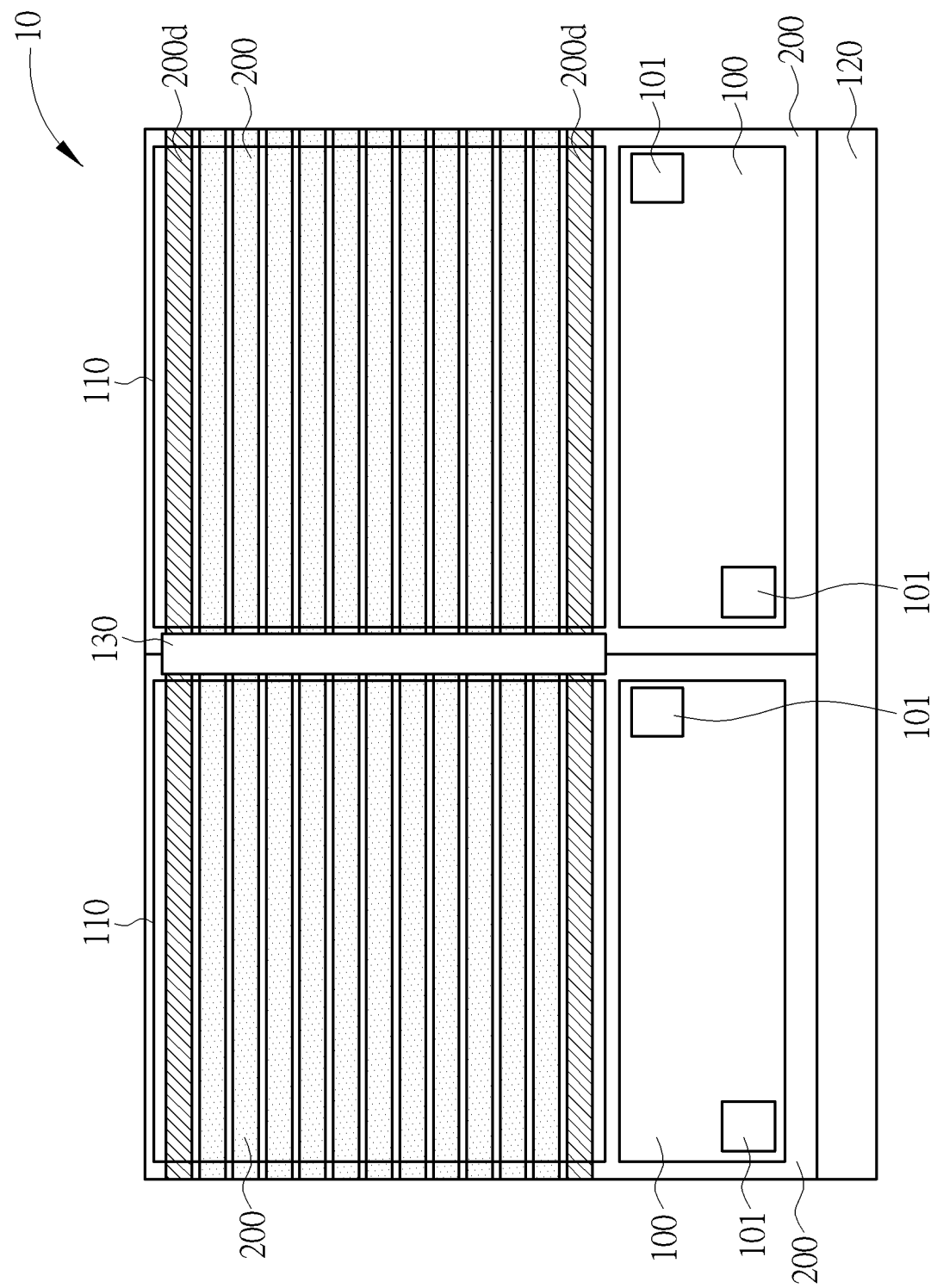
FIG. 2 is a schematic diagram showing an exemplary NAND architecture with pool capacitors for power sources, wherein the memory arrays are illustrated in a superimposing manner.
Figure 3:
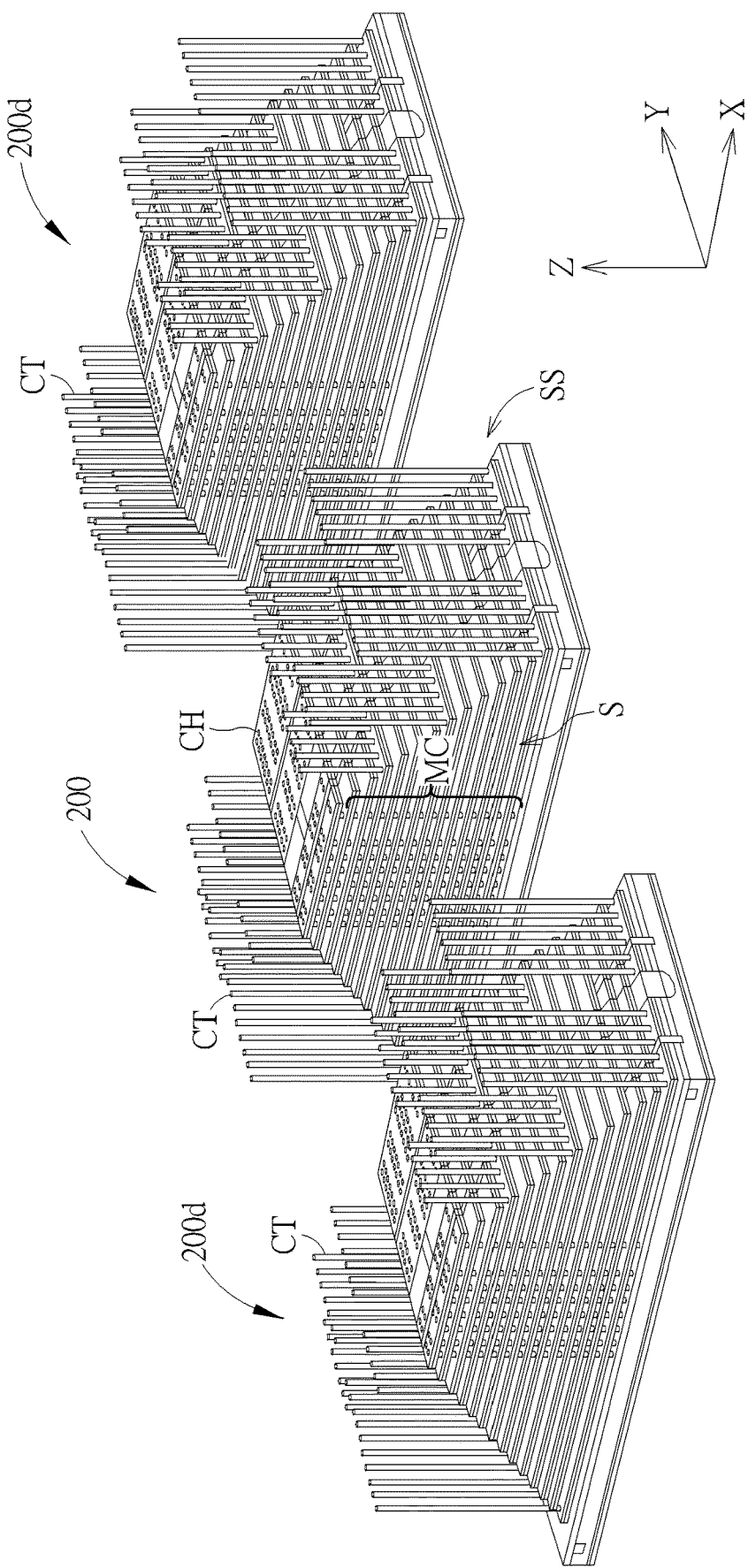
FIG. 3 is an enlarged, perspective view of FIG. 2 schematically showing the dummy blocks and memory blocks in the same page of memory arrays.

FIG. 2 is a schematic diagram showing an exemplary NAND architecture with pool capacitors for power sources, wherein the memory arrays are illustrated in a superimposing manner in accordance with one embodiment of the invention. Like regions, layers or elements are designated by like numeral numbers. FIG. 3 is an enlarged, schematic view showing the dummy blocks and memory blocks in the same page of memory arrays.

As shown in FIG. 2 and FIG. 3, a plurality of memory blocks 200 of the NAND memory device 10 may be grouped into pages corresponding to the underlying page buffer regions 110. The memory blocks 200 may comprise strings of memory cells MC so as to form a 3D memory structure. For example, semiconductor pillars may be formed in the channel holes CH that vertically penetrate through a conductor-dielectric pair stack S. The 3D memory structure may further comprise stair structure SS at the two opposite ends of each memory block 200 for the formation of contacts CT such as through array contacts (TACs).

In the flash NAND memory element, an erase operation can be performed for each memory block, and a read/write operation can be performed for each memory page. The array block is the core area in the memory device that performs the memory function. In order to achieve higher storage density, the number of vertical 3D memory stack layers is greatly increased, thereby increasing manufacturing complexity and cost. The peripheral circuit regions 100 of the NAND memory device 10 provide support for the memory arrays. It is to be understood that the peripheral circuit regions 100 may include digital signal circuits, analog signal circuits, and/or mixed signal circuits such as row decoders and column decoders, drivers, page buffers, sense amplifiers, timing and control, or the like. The peripheral circuit regions 100 may comprise active and/or passive semiconductor components, such as transistors, diodes, capacitors, resistors, etc., as will be apparent to those of ordinary skill in the art.

In 3D memory architecture, memory cells for storing data are stacked vertically to form a stacked memory structure. The 3D memory element can include a stepped structure formed on one or more sides of the stacked memory structure for purposes of, for example, word line fan-out. The stacked memory structure includes a plurality of semiconductor channels, wherein the semiconductor channel can be vertical to the major surface of a semiconductor substrate. As the demand for higher storage capacity continues to increase, the number of vertical levels of stacked storage structures also increases.

According to one embodiment, the NAND memory device 10 further comprises multiple dummy blocks 200d in the memory arrays. According to one embodiment, the dummy blocks 200d are disposed at the outskirt (or outermost row or column) of each page of the memory arrays. These dummy blocks 200d have similar structure as that of the memory blocks 200 in the memory arrays, but these dummy blocks 200d are not used to store data. Instead, these dummy blocks 200d are utilized as supplemental pool capacitors within the memory arrays. It is to be understood that although the dummy blocks 200d are shown to be located at the edges of each page of the memory arrays, the location of the dummy may depend upon design requirements. In some embodiments, the dummy blocks 200d may be disposed elsewhere in each page of the memory arrays. Nevertheless, it is beneficial to use the blocks at the outskirt of the memory arrays as dummy blocks because these outermost blocks typically suffer from process variations and have less uniformity.

It is to be understood that the dimension and number of the dummy blocks 200d in each page of the memory arrays in FIG. 2 are for illustration purposes only. In some embodiments, there may be only one dummy block utilized as the supplementary pool capacitor in each page of the memory arrays, while in some other embodiments, there may be more than two dummy blocks utilized as supplementary pool capacitors in each page of the memory arrays. Further, it is to be understood that the dummy block does not have to be located right next to the page buffer or to be used only for the page buffer.

Figure 4:
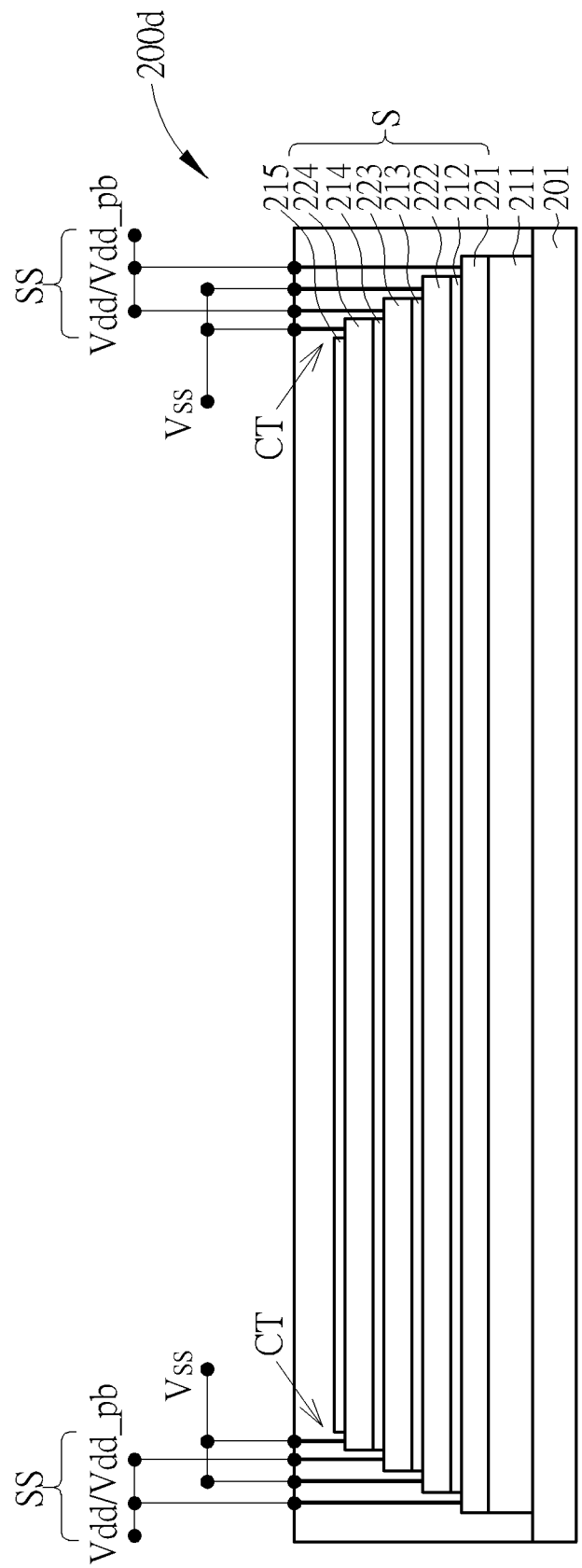
FIG. 4 is a schematic, cross-sectional diagram showing an exemplary dummy block that is utilized as a pool capacitor according to one embodiment of the invention.

FIG. 4 is a schematic, cross-sectional diagram showing an exemplary dummy block that is utilized as a pool capacitor according to one embodiment of the invention. As shown in FIG. 4, the dummy block 200d is fabricated on a semiconductor substrate 201 including, but not limited to, a silicon substrate, a silicon germanium substrate, a silicon carbide substrate, a silicon-on-insulator (SOI) substrate, a glass substrate, or any suitable substrates. An alternating layer stack S is formed on the substrate 201. According to one embodiment, the alternating layer stack S may comprise a plurality of conductive layer/dielectric layer pairs.

For the sake of simplicity, only dielectric layers 211-215 and conductive layers 221-224 are illustrated in FIG. 4. It is understood that the number of layers of the alternating layer stack S in FIG. 4 is for illustration purposes only. For example, the number of the conductive layer/dielectric layer pairs may be 8, 16, 32 or 64, but is not limited thereto. The conductive layers in the alternating layer stack S act as word line straps in the memory blocks 200. In the dummy blocks 200d, these conductive layers 221-224 act as capacitor electrode plates and the dielectric layers 211-214 act as capacitor dielectric.

According to one embodiment, the conductive layers 221 and 223 may be electrically coupled to a power source such as $V_{DD}$ or $V_{DD\_PB}$ ($V_{DD\_PB}$ is power only for the page buffer, a kind of internal power source) and the conductive layers 222 and 224 may be electrically coupled to a reference voltage $V_{SS}$ such as ground potential. By providing such configuration, capacitors are formed between the conductive layers 221-224. It is to be understood that the aforesaid power source is not limited to internal power. In some embodiments, the aforesaid power source may comprise external power such as voltages supplied by users or systems. The term "internal power" refers to voltages created by circuits like regulators.

Figure 5:
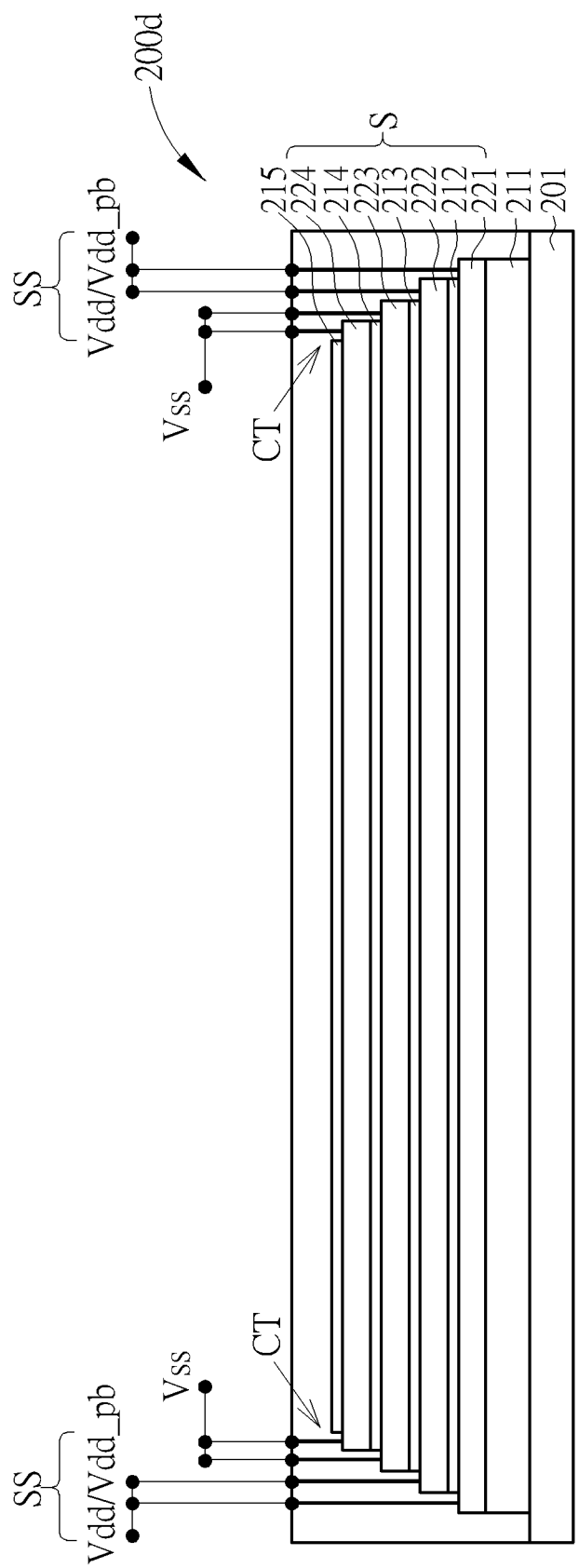
FIG. 5 is a schematic, cross-sectional diagram showing an exemplary dummy block that is utilized as a pool capacitor according to another embodiment of the invention.

FIG. 5 is a schematic, cross-sectional diagram showing an exemplary dummy block that is utilized as a pool capacitor according to another embodiment of the invention, wherein like layers, regions or elements are designated by like numeral numbers. As shown in FIG. 5, likewise, an alternating layer stack S is formed on the substrate 201. According to one embodiment, the alternating layer stack S may comprise a plurality of conductive layer/dielectric layer pairs. For the sake of simplicity, only dielectric layers 211-215 and conductive layers 221-224 are illustrated in FIG. 5. It is understood that the number of layers of the alternating layer stack S in FIG. 5 is for illustration purposes only. For example, the number of the conductive layer/dielectric layer pairs may be 8, 16, 32 or 64, but is not limited thereto. The conductive layers in the alternating layer stack S act as word line straps in the memory blocks 200. In the dummy blocks 200d, these conductive layers 221-224 act as capacitor electrode plates and the dielectric layers 211-214 act as capacitor dielectric.

According to one embodiment, the conductive layers 221 and 222 may be electrically coupled to a power source such as $V_{DD}$ or $V_{DD\_PB}$ and the conductive layers 223 and 224 may be electrically coupled to a reference voltage $V_{SS}$ such as ground potential. By providing such configuration, a capacitor is formed between the conductive layer 222 and the conductive layer 223. By coupling two or more adjacent or neighboring conductive layers to one voltage source, the resistance may be reduced.

Figure 6:
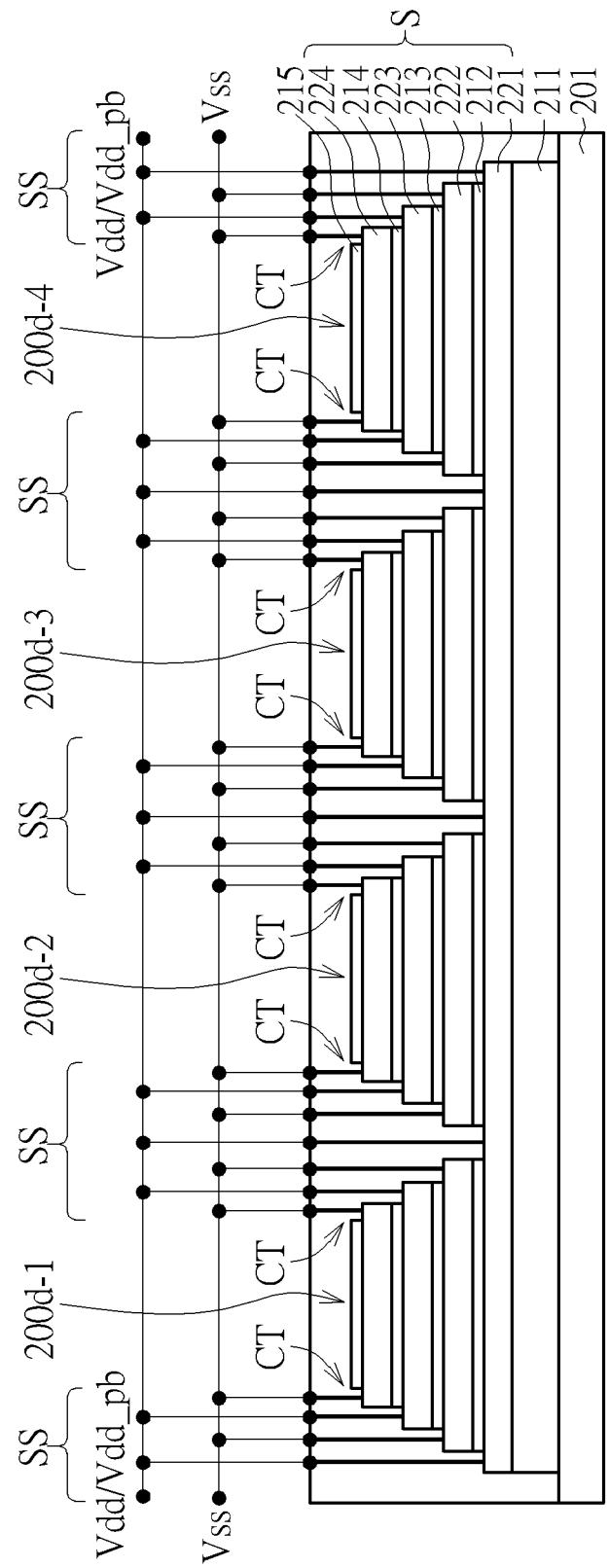
FIG. 6 is a schematic, cross-sectional diagram showing an exemplary dummy block that is utilized as a pool capacitor according to still another embodiment of the invention.

FIG. 6 is a schematic, cross-sectional diagram showing an exemplary dummy block that is utilized as a pool capacitor according to still another embodiment of the invention, wherein like layers, regions or elements are designated by like numeral numbers. As shown in FIG. 6, likewise, an alternating layer stack S is formed on the substrate 201. According to one embodiment, the alternating layer stack S may comprise a plurality of conductive layer/dielectric layer pairs. For the sake of simplicity, only dielectric layers 211-215 and conductive layers 221-224 are illustrated in FIG. 6. It is understood that the number of layers of the alternating layer stack S in FIG. 6 is for illustration purposes only. For example, the number of the conductive layer/dielectric layer pairs may be 8, 16, 32 or 64, but is not limited thereto. The conductive layers in the alternating layer stack S act as word line straps in the memory blocks 200. In the dummy blocks 200d, these conductive layers 221-224 act as capacitor electrode plates and the dielectric layers 211-214 act as capacitor dielectric.

The difference between the dummy block in FIG. 4 and the dummy block in FIG. 6 is that the dummy block in FIG. 6 is split into several sub-blocks 200d-1, 200d-2, 200d-3, and 200d-4. Although the sub-blocks 200d-1, 200d-2, 200d-3, and 200d-4 have approximately the same dimensions and lengths in FIG. 6, it is possible to form sub-blocks with different dimensions or lengths in other embodiments.

According to one embodiment, the conductive layers 221 and 223 of each of the sub-blocks 200d-1, 200d-2, 200d-3, and 200d-4 may be electrically coupled to a power source such as $V_{DD}$ or $V_{DD\_PB}$ ($V_{DD\_PB}$ is power only for the page buffer, a kind of internal power source) and the conductive layers 222 and 224 of each of the sub-blocks 200d-1, 200d-2, 200d-3, and 200d-4 may be electrically coupled to a reference voltage $V_{SS}$ such as ground potential. By providing such configuration, capacitors are formed between the conductive layers 221-224. It is to be understood that the aforesaid power source is not limited to internal power. In some embodiments, the aforesaid power source may comprise external power such as voltages supplied by users or systems. The term "internal power" refers to voltages created by circuits like regulators.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A non-volatile memory device, comprising:
   a plurality of memory blocks grouped into pages, wherein at least one of the memory blocks is a dummy block, wherein the dummy block and the plurality of memory blocks have the same structure;
   page buffer regions corresponding to the pages of the plurality of memory blocks; and
   a peripheral circuit region for supporting operations of the pages of the plurality of memory blocks, wherein the peripheral circuit region comprises a plurality of pool capacitors, wherein the dummy block is configured to form a supplementary pool capacitor for suppressing power noise.

2. The non-volatile memory device according to claim 1, wherein the dummy block comprises a substrate and an alternating layer stack on the substrate.

3. The non-volatile memory device according to claim 2, wherein the alternating layer stack comprises multiple conductive layers and multiple dielectric layers alternately laminated on one another.

4. The non-volatile memory device according to claim 3, wherein the dummy block further comprises:
   stair structures at two opposite ends of the dummy block; and
   contacts disposed on the stair structures and electrically connected to the multiple conductive layers.

5. The non-volatile memory device according to claim 4, wherein the multiple conductive layers are sequentially and alternately biased to a power source and a ground potential via the contacts disposed on the stair structures, thereby forming capacitors between the multiple conductive layers, wherein the multiple dielectric layers act as a capacitor dielectric.

6. The non-volatile memory device according to claim 5, wherein the power source comprises an internal power source or an external power source.

7. The non-volatile memory device according to claim 4, wherein at least two neighboring conductive layers of the multiple conductive layers are biased to a same power source via the contacts disposed on the stair structures.

8. The non-volatile memory device according to claim 1, wherein the dummy block is disposed at an outskirt of each of the pages of the plurality of memory blocks.

9. The non-volatile memory device according to claim 1, wherein the dummy block is split into multiple sub-blocks.

10. A non-volatile memory device, comprising:
    a plurality of memory blocks grouped into pages, wherein at least one of the memory blocks is a dummy block configured to form a supplementary pool capacitor for suppressing power noise, wherein the dummy block and the plurality of memory blocks have the same structure.

* * * * *